United States Patent
Urard et al.

(10) Patent No.: US 7,032,165 B2
(45) Date of Patent: Apr. 18, 2006

(54) ACS UNIT IN A DECODER

(75) Inventors: Pascal Urard, Theys (FR); Thierry Valentin, Le Touvet (FR)

(73) Assignee: STMicroelectronics S.A., Montrouge (FR)

( * ) Notice: Subject to any disclaimer, the term of this patent is extended or adjusted under 35 U.S.C. 154(b) by 533 days.

(21) Appl. No.: 10/357,561

(22) Filed: Feb. 4, 2003

(65) Prior Publication Data

US 2003/0149931 A1  Aug. 7, 2003

(30) Foreign Application Priority Data

Feb. 4, 2002  (FR) .................................. 02 01306

(51) Int. Cl.
*H03M 13/03*  (2006.01)
(52) U.S. Cl. ..................................... 714/796
(58) Field of Classification Search ........ 714/794–796, 714/786, 791; 375/341
See application file for complete search history.

(56) References Cited

U.S. PATENT DOCUMENTS

| | | | |
|---|---|---|---|
| 5,815,515 A * | 9/1998 | Dabiri | 714/795 |
| 6,301,314 B1 | 10/2001 | Murayama | |
| 6,445,755 B1 * | 9/2002 | Chung et al. | 375/341 |
| 2001/0007142 A1 | 7/2001 | Hocevar et al. | |
| 2001/0021233 A1 * | 9/2001 | Jin | 375/341 |
| 2001/0034870 A1 | 10/2001 | Kravtchenko et al. | |
| 2003/0028846 A1 * | 2/2003 | Garrett | 714/796 |
| 2003/0039323 A1 * | 2/2003 | Choi | 714/795 |

OTHER PUBLICATIONS

Boutillon et al., VLSI Architectures for the MAP Algorithm, Feb. 2003, IEEE Trans. on Comm. vol. 51, No. 2, p. 175-185.*

* cited by examiner

*Primary Examiner*—Shelly Chase
(74) *Attorney, Agent, or Firm*—Lisa K. Jorgenson; James H. Morris; Wolf, Greenfield & Sacks, P.C.

(57) ABSTRACT

A device for implementing a function of add-compare-select type in an error correction code decoder, having first and second adders for adding, respectively for first and second branches, branch metric values, intermediate value of former state metrics, and values of former state metric offset, thus forming first and second values of present state metrics; a comparator, coupled to the first and second adders, for selecting the highest value from among the first and second values; circuitry for determining a digital value of present state metric offset including a single bit, based on the first and second values.

21 Claims, 3 Drawing Sheets

ACS UNIT IN A DECODER

BACKGROUND OF THE INVENTION

1. Field of the Invention

The present invention generally relates to signal decoders, such as, for example decoders of turbodecoder type. More specifically, the present invention relates to specific units used in such decoders, generally called ACS units ("Add-Compare-Select"), which perform additions to provide two data, then compare the two data and select one datum from among the two data.

2. Discussion of the Related Art

One of the aims of digital communications is faultless data transmission. During transmission, the data are submitted to noise that may cause errors on the received data. To improve the reliability upon data transmission, error correction techniques are used. A known error correction technique is convolutional coding. This technique provides an efficient error correction but requires sophisticated decoding techniques.

Error correction codes have a significant technical effect since they enable error correction on data transmitted between a transmitter and a receiver in applications such as telecommunications.

Convolution codes enable the receiver of digital data to properly determine the transmitted data even when errors have occurred in the transmission. Convolution codes introduce redundancies in the data to be transmitted and provide the sequentially transmitted data in packets in which the value of each bit is dependent on preceding bits in the sequence. Thus, when errors occur, the receiver can deduce the original data by retracing the possible sequences of received data.

To further improve the coding efficiency, coding methods comprise interleavers, which mix the order of the bits in the coded packets. Thus, when adjacent bits are altered during transmission, the error is distributed over the entire initial packet and can thus more easily be corrected.

Other improvements may comprise coders which code the data to be transmitted more than once, in parallel or in series. For example, error correction methods which transmit coded data packets for which each packet is formed by the juxtaposition of uncoded initial data, of first coded data resulting from the coding of the initial data by a first coder, and of second coded data resulting from the coding of the initial data by a second coder preceded by an interleaver, are known. Such an error correction method is called a systematic parallel convolutional coding (SPCC).

Such codes are often decoded with an iterative algorithm, called turbodecoding, which is relatively efficient to reach relatively low error rates.

For such codes, an optimal decoding is often a very complex task. Iterative decoding techniques have thus been developed to solve this problem. Rather than immediately determining whether the received data are equal to "0" or to "1", the receiver assigns to each received datum a value on a scale of several levels representing the probability for the datum to be equal to "1". A conventional scale, which is usually called the "log-likelihood ratio" LLR, represents each decoded datum x as an integer in a given scale, for example, from 1 to 15. For a received datum r, ratio LLR is determined as follows:

$$LLR(x) = \log\left(\frac{Pr(x=1/r)}{Pr(x=0/r)}\right) \quad (1)$$

where $Pr(x=1/r)$ represents the probability for decoded datum x to be equal to "1" for received datum r and $Pr(x=0/r)$ represents the probability for decoded datum x to be equal to "0" for received datum r.

The iterative decoding method receives an input sequence corresponding to probabilities for each received value and outputs corrected probabilities. The iterative decoding is performed by several iterations until it is believed that the corrected probability sufficiently closely represents the transmitted datum.

The value of ratio LLR is then compared with a threshold to determine the value of decoded datum x. For example, the decoded datum is taken as being equal to "1" when ratio LLR is positive, and to "0" otherwise. Ratio LLR thus contains both an information representative of the value of decoded datum x and an information representative of the reliability of the value of the decoded datum.

The calculation algorithm of ratio LLR is based on a treillis similar to that used in the Viterbi algorithm.

FIG. 1 represents an example of a treillis with N states, N being equal to 4 in FIG. 1. Four states $S_i$, i ranging from 1 to 4, are shown along the vertical direction. Different times k, k ranging from 1 to 5, are show along the horizontal direction. Each point $S_{i,k}$ of the treillis represents the i-th state at time k. One state can represent a sequence of a determined number of bits corresponding to the last bits received by the decoder. For a treillis with four states, each state can be associated with one of the sequences ("00", "01", "10", "11"). A branch 5 represents a transition between a state at a time k and a state at a time k+1. The transition from one state to another corresponds to the receiving by the decoder of a datum ideally corresponding to a bit of value "0" or "1". From a state at a time k, for example, state $S_{2,3}$, there are thus only two possible transitions to states $S_{3,4}$ and $S_{4,4}$ according to whether the received datum is a bit of value "0" or "1".

In practice, the datum $r_k$ received at a time k is an analog datum. A metric $\gamma_k$ of the branch corresponding to a possible transition from state $S_{i,k}$ to a state $S_{m,k+1}$ is determined for a treillis branch connecting state $S_{i,k}$ and state $S_{m,k+1}$. The branch metric corresponds to a distance between received datum $r_k$ and datum $x_k(S_{i,k}, S_{m,k+1})$ which should have been received for the branch. It may be calculated as follows:

$$\gamma_k(S_{i,k}, S_{m,k+1}) = e^{\frac{-1}{2\sigma^2}\|r_k - x_k(S_{i,k}, S_{m,k+1})\|^2} \quad (2)$$

where $\sigma^2$ is the noise variance associated with received datum $r_k$.

The calculation algorithm of ratio LLR comprises three main steps.

At a time k, for each state $S_{i,k}$, i ranging from 1 to N, a forward probability $\alpha_k(S_{i,k})$ of being at state $S_{i,k}$ is calculated as follows:

$$\alpha_k(S_{i,k}) = \sum_{l=1}^{N} \sum_{j=0}^{1} \alpha_{k-1}(S_{l,k-1}) \gamma_k^j(S_{l,k-1} S_{i,k}) \quad (3)$$

For each state $S_{i,k}$, i ranging from 1 to N, a backward probability $\beta_k(S_{i,k})$ of being at state $S_{i,k}$ is calculated at time k with the following equation:

$$\beta_k(S_{i,k}) = \sum_{l=1}^{N} \sum_{j=0}^{1} \beta_{k+1}(S_{l,k+1}) \gamma_{k+1}^j(S_{i,k}, S_{l,k+1}) \quad (4)$$

Based on these two probabilities, ratio LLR is calculated as follows:

$$LLR(x_k) = \log \frac{\sum_{(i,l) \in B(k,1)} \alpha_{k-1}(S_{1,k-1}) \gamma_k^1(S_{1,k-1}, S_{i,k}) \beta_k(S_{i,k})}{\sum_{(i,l) \in B(k,0)} \alpha_{k-1}(S_{1,k-1}) \gamma_k^0(S_{1,k-1}, S_{i,k}) \beta_k(S_{i,k})} \quad (5)$$

where B(k,0) (respectively B(k, 1)) is the set of the possible transitions from a state $S_{1,k-1}$ to a state $S_{i,k}$ caused by an input datum equal to "0" (respectively, "1").

The calculation of ratio LLR requires calculation of multiplications and exponential values. These operations are difficult to implement. For this purpose, the following function is introduced:

$$\text{MAX}^+(x, y) = \ln(e^x + e^y) = \text{MAX}(x, y) + \ln(1 + e^{-|x-y|}) \quad (6)$$

where term $\ln(1+e^{-|x-y|})$ is a correction value called the offset value. The offset value may be obtained by means of a memory, for example, a ROM, in which are stored values of function $\ln(1+e^{-|v|})$ over a predetermined number of bits for certain values $|v|$ coded over a determined number of bits. Thus:

$$\ln\left(\sum_{i=0}^{N} e^{x_i}\right) = \text{MAX}^+\left(\ln\left(\sum_{i=0}^{N-1} e^{x_i}\right), x_i\right) \quad (7)$$
$$= \text{MAX}^+\left(\text{MAX}^+\left(\ln\left(\sum_{i=0}^{N-2} e^{x_i}\right), x_{N-1}\right), x_N\right) = \ldots$$
$$= \text{MAX}^+_{i \in [1,N]}(x_i)$$

The following definitions are thus introduced:

$$\overline{\gamma}_k(S_{m,n}, S_{i,k}) = \log(\gamma_k(S_{m,n}, S_{i,k})) \quad (8)$$

$$\overline{\alpha}_k(S_{i,k}) = \log(S_{i,k}) \quad (9)$$

Term $\overline{\alpha}_k(S_{i,k})$ is called the forward state metric for state $S_{i,k}$, or the forward path metric for state $S_{i,k}$.

$$\overline{\beta}_k(S_{i,k}) = \log(\beta_k(S_{i,k})) \quad (10)$$

Term $\overline{\beta}_k(S_{i,k})$ is called the backward state metric for state $S_{i,k}$, or the backward path metric for state $S_{i,k}$.

As a result:

$$\overline{\alpha}_k(S_{i,k}) = \underset{m,j}{\text{MAX}^+}(\overline{\alpha}_{k-1}(S_{m,k-1}) + \overline{\gamma}_k^{-j}(S_{m,k-1}, S_{i,k})) \quad (11)$$

$$\overline{\beta}_{k-1}(S_{i,k-1}) = \underset{m,j}{\text{MAX}^+}(\overline{\beta}_k(S_{m,k}) + \overline{\gamma}_k^{-j}(S_{i,k-1}, S_{m,k})) \quad (12)$$

The expression of ratio LLR then becomes:

$$LLR(x_k) = \underset{(i,m) \in B(k,1)}{\text{MAX}^+}(\overline{\alpha}_{k-1}(S_{m,k-1}) + \overline{\gamma}_k^1(S_{m,k-1}, S_{i,k}) + \overline{\beta}_k(S_{i,k})) - \quad (13)$$
$$\underset{(i,m) \in B(k,0)}{\text{MAX}^+}(\overline{\alpha}_{k-1}(S_{m,k-1}) + \overline{\gamma}_k^0(S_{m,k-1}, S_{i,k}) + \overline{\beta}_k(S_{i,k}))$$

The calculation of the forward and backward metrics $\overline{\alpha}_k(S_{i,k})$ and $\overline{\beta}_k(S_{i,k})$ is performed by specific units of the decoder called ACSO ("ADD-COMPARE-SELECT-OFFSET") units which implement function MAX$^+$.

The calculation of the state metric values must be performed at least at the data receive frequency. The higher the data receive frequency, the more difficult it is to perform these calculation operations in a single data cycle. For this purpose, there exist many configurations of units of ACSO type to reduce the duration of the operation performed by the unit. However, the limiting operating frequencies of the decoder are easily reached. The duration of the operation performed by the ACSO unit is thus a critical factor to be taken into account upon design of a decoder.

SUMMARY OF THE INVENTION

The present invention aims at obtaining a fast device of ACSO type.

The present invention also aims at obtaining a device of ACSO type of particularly simple design.

To achieve these and other objects, the present invention provides a device for implementing a function of add-compare-select type in an error correction code decoder, comprising a first adder for adding, for a first branch, a branch metric value, an intermediate value of former state metric, and a value of former state metric offset, thus forming a first value of present state metric; a second adder for adding, for a second branch, a branch metric value, an intermediate value of former state metric, and an offset value of former state metric, thus forming a second value of present state metric; a comparator, coupled to the first and second adders, for selecting the highest value from among the first and second values of present state metrics; a first storage means for storing the selected value of present state metric; means for determining a digital value of present state metric offset comprised of a single bit, based on the first and second values of present state metrics; and a second storage means for storing the offset value of present state metric.

According to an embodiment of the present invention, the means for determining the digital offset value of present state metric comprise means, coupled to the first and second adders, for determining the absolute value of the difference between the first and second values of present state metrics; and a logic operator, coupled to the means for determining the digital offset value of present state metric, from said absolute value.

According to an embodiment of the present invention, the means for determining the absolute value comprise a first subtractor, coupled to the first and second adders, for determining a first difference between the first value of present state metric and the second value of present state metric; a second subtractor, coupled to the first and second adders, for determining a second difference between the second value of present state metric and the first value of present state metric; means, coupled to the first and second subtractors, for comparing the first and second differences and selecting the difference with the highest value.

According to an embodiment of the present invention, the logic operator comprises an extractor, coupled to the means for determining the absolute value, for extracting a determined number of bits from the bits of the absolute value; a calculation unit for providing the digital offset value of present state metric of a single bit based on the extracted bits.

According to an embodiment of the present invention, the means for determining the digital offset value of present state metric comprise a first subtractor, coupled to the first and second adders, for determining a first difference between the first value of present state metric and the second value of present state metric; a second subtractor, coupled to the first and second adders, for determining a second difference between the second value of present state metric and the first value of present state metric; a first extractor, coupled to the first subtractor, for providing a first extracted datum comprising a determined number of bits from among the bits of the first difference; a second extractor, coupled to the second subtractor, for providing a second extracted datum comprising a determined number of bits from among the bits of the second difference; a first calculation unit, coupled to the first extractor, for providing a first one-bit selection datum from the value of the bits forming the first extracted datum; a second calculation unit, coupled to the second extractor, for providing a second one-bit selection datum from the value of the bits forming the second extracted datum; means, coupled to the first and second calculation units, for comparing the first and second selection data and selecting the selection datum having the smallest value as the offset value of present state metric.

The present invention also provides a method for implementing a function of add-compare-select type for an error correction code decoding, comprising the steps of adding, for a first branch, a branch metric value, an intermediate value of former state metric, and an offset value of former state metric, thus forming a first value of present state metric; adding, for a second branch, a branch metric value, an intermediate value of former state metric, and an offset value of former state metric, thus forming a second value of present state metric; selecting the highest value from the first and second values of present state metrics; storing the selected value of present state metric; determining a digital offset value of present state metric comprised of a single bit, from the first and second values of present state metrics; and storing the offset value of present state metric.

According to an embodiment of the present invention, the step of determination of the digital offset value of present state metric comprises the steps of determining the absolute value of the difference between the first and second values of present state metrics; and determining a digital offset value of present state metric comprised of a single bit, from said absolute value.

According to an embodiment of the present invention, the step of determination of the digital offset value of present state metric comprises the steps of determining a first difference between the first value of present state metric and the second value of present state metric; determining a second difference between the second value of present state metric and the first value of present state metric; providing a first extracted datum comprising a determined number of bits from among the bits of the first difference; providing a second extracted datum comprising a determined number of bits from among the bits of the second difference; providing a first one-bit selection datum from the value of the bits forming the first extracted datum; providing a second one bit selection datum based on the value of the bits forming the second extracted datum; and comparing the first and second selection data and selecting the selection datum having the smallest value as the offset value of present state metric.

The foregoing objects, features and advantages of the present invention, will be discussed in detail in the following non-limiting description of specific embodiments in connection with the accompanying drawings.

DETAILED DESCRIPTION

Figure 1:
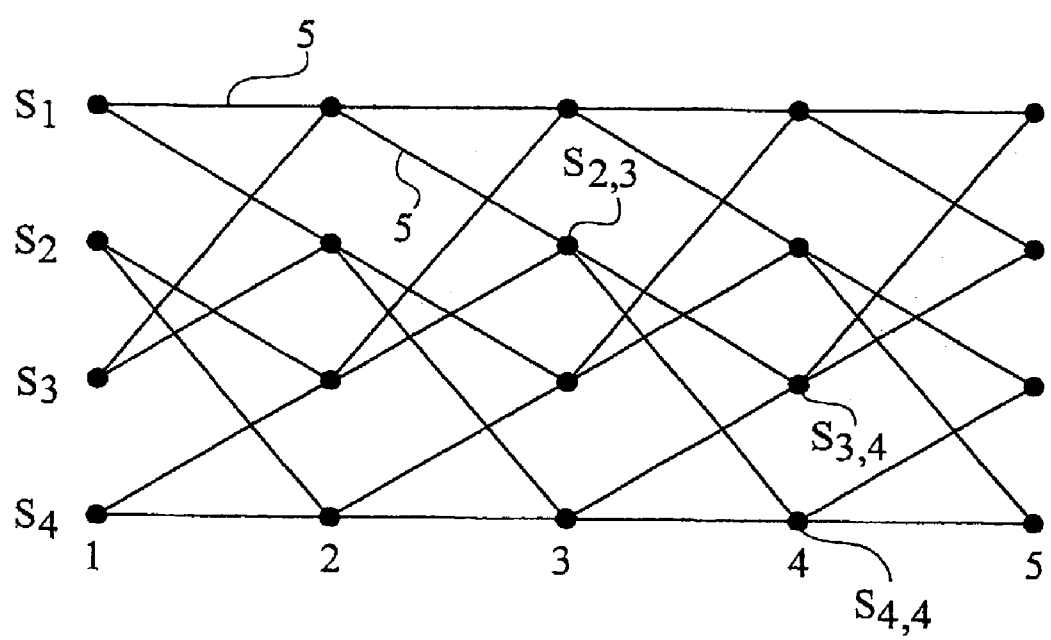
FIG. 1, previously described, shows an example of a treillis used by a decoding algorithm.
Figure 2:
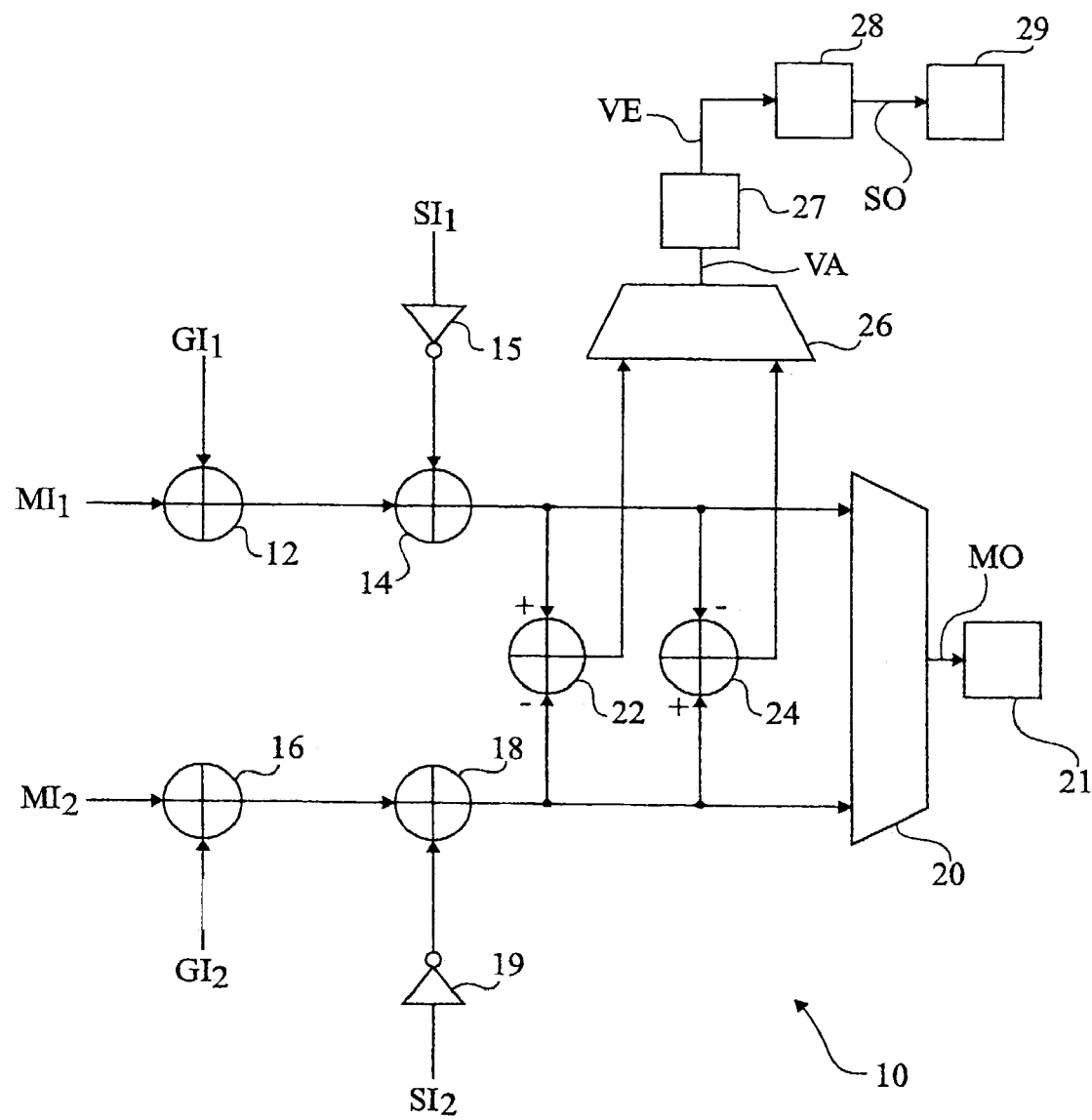
FIG. 2 shows a first embodiment of an ACSO unit according to the present invention.

FIG. 2 shows an ACSO unit 10 enabling calculation of the state metric (forward of backward) of a considered state at a given time k. Hereafter, "state metric" will be used to describe either a forward state metric or a backward state metric and, when reference is made to a state adjacent to the considered state, this means a state at a time k+1 subsequent or k−1 prior to the considered state, according to the considered metric.

ACSO unit 10 receives as an input first data $MI_1$ and $MI_2$ which represent intermediate state metric values respectively of a first state adjacent to the considered state, and of a second state adjacent to the considered state. Data $MI_1$ and $MI_2$ are coded over a number of bits and a read from a memory.

ACSO unit 10 also receives as an input data $GI_1$ and $GI_2$ which represent branch metrics respectively for the branch between the first adjacent state and the considered state, and for the branch between the second adjacent state and the considered state.

The ACSO unit also receives as an input data $SI_1$ and $SI_2$ which represent offset data respectively associated with the state metric of the first adjacent state and with the state metric of the second adjacent state. $SI_1$ and $SI_2$ each comprise a single bit.

Unit 10 comprises a first adder 12 which adds data $MI_1$ and $GI_1$ and a second adder 14 which adds the sum provided by adder 12 and datum $SI_1$ inverted by an inverter 15.

Unit 10 comprises a third adder 16 adding datum $MI_2$ and datum $GI_2$, and a fourth adder 18 adding the sum provided by adder 16 and datum $SI_2$ inverted by an inverter 19.

The sum of data $MI_1$, $GI_1$, and $SI_1$, corresponds to a first state metric value of the considered state for a path crossing the first adjacent state. The sum of data $MI_2$, $GI_2$, and $SI_2$ corresponds to a second state metric value of the considered state for a path running through the second adjacent state.

A selector 20 receives as an input the first and second state metrics and selects between the two state metrics of the considered state the state metric having the highest value. The selected state metric is kept in a memory 21, for example, a series of parallel latches.

The first and second state metric values of the considered state supply a first subtractor 22 which provides a first difference between the first state metric value and the second state metric value. The first and second state metric values supply a second subtractor 24 which provides a second difference between the second state metric value and the first state metric value. The first and second differences thus have the same absolute value and are of opposite signs.

A selector 26 receives as an input the difference provided by subtractors 22 and 24. It selects, among the two differences, the difference with the highest value called VA, that is, the difference of positive sign, which is thus equal to the absolute value of the difference between the first and second state metric values of the considered state. Absolute value VA between the first and second state metric values is thus advantageously determined in a simple manner by means of two subtractors 22, 24 and of a selector 26.

Absolute value VA is transmitted to an extractor 27 which provides a datum VE corresponding to a determined number of the most significant bits of datum VA. A calculation unit 28 receives datum VE and provides a one-bit datum SO which is equal to "1" if at least one bit of the significant bit datum is equal to "1", and which is equal to "0" otherwise. Datum SO is stored in a memory 29, for example, a latch.

In the successive iterations performed for the decoding of the data received by the decoder, data MO and SO provided by ACSO unit 10 in an iteration are used by one of the ACSO units 10 of the decoder respectively as input data $MI_1$ or $MI_2$ and $SI_1$ or $SI_2$ in the next iteration.

To each unit ACSO is associated an additional adder (not shown) adding datum MO and the inverse of SO. The obtained datum corresponds to the state metric of the present state and is stored when the calculation algorithm has converged.

Figure 3:
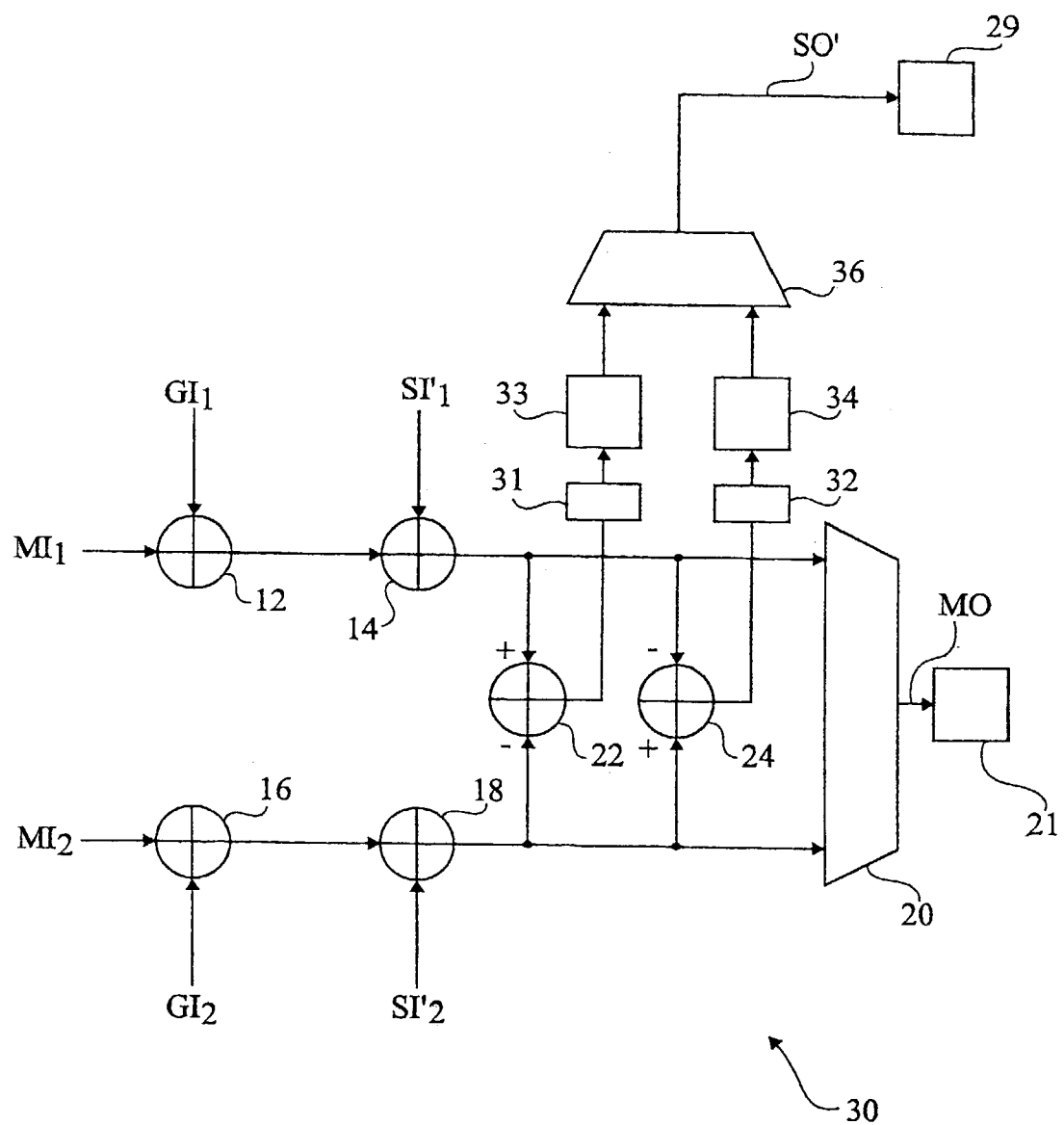
FIG. 3 shows a second embodiment of an ACSO unit according to the present invention.

FIG. 3 shows a second embodiment of ACSO unit 30. The elements of FIG. 3 performing the same functions as the element of FIG. 2 are shown with the same references, and their operation will not been explained again hereafter. In FIG. 3, second adder 14 receives as an input the sum of first adder 12 that it adds to a datum $SI_1'$. Fourth adder 18 receives as an input the sum of third adder 16 that it adds to a datum $SI_2'$. Data $SI_1'$ and $SI_2'$ represent offset data respectively associated with the state metric of the first adjacent state and with the state metric of the second adjacent state. $SI_1'$ and $SI_2'$ each are comprised of a single bit.

The output of each subtractor 22, 24, supplies an extractor unit 31, 32, which provides a datum corresponding to a determined number of the most significant bits of the datum of subtractor 22, 24. A calculation unit 33 receives as an input the datum provided by extractor 31 and provides a one-bit datum which is equal to "0" if at least one bit of the datum received by unit 33 is equal to "1" and which is equal to "1" otherwise. A calculation unit 34 receives as an input the datum provided by extractor 32 and provides a one-bit datum which is equal to "0" if at least one bit of the datum received by unit 34 is equal to "1", and which is equal to "1" otherwise.

A selector 36 receives as an input the one-bit data provided by calculation units 33, 34 and selects the datum having the highest value, called SO', which is stored in memory 29.

Datum SO' provided by ACSO unit 30 in an iteration is used by one of the ACSO units 30 of the decoder respectively as input datum $SI_1'$ or $SI_2'$ at the next iteration.

The applicant has shown that upon operation of a conventional ACSO unit, the operation with the most penalizing duration is the determination of the offset value, which is performed by a ROM to which a datum |v|, comprising a determined number of bits, is assigned as an input, and which outputs a datum $\ln(1+e^{-|v|})$ over a predetermined number of bits, or by a synthesized operation. The applicant has shown that the use of a one-bit offset value causes no remarkable degradation of the decoder performances. Indeed, the decoder comprises other systems such as an analog-to-digital converter, the operation of which is more penalizing for the decoder performances, so that the use of a one-bit offset value has but a small influence on the general decoder performances.

The ACSO unit according to the present invention comprises no large-capacity memory, for example a ROM, unlike a conventional ACSO unit, and is formed with simple logic operators only. The unit thus has a particularly simple architecture which enables reducing the operation duration of an iteration of the ACSO unit.

The time gain obtained by the present invention further allows for the adjunction of additional logic operators in the ACSO unit to implement tests most often carried out before selling of the decoder.

Of course, the present invention is likely to have various alterations, modifications, and improvements which will readily occur to those skilled in the art. In particular, each of the described components may be replaced with one or several components performing the same function. Thus, the first and second (third and fourth) adders may be replaced with a three-input adder.

Such alterations, modifications, and improvements are intended to be part of this disclosure, and are intended to be within the spirit and the scope of the present invention. Accordingly, the foregoing description is by way of example only and only as defined in the following claims and the equivalents is not intended to be limiting. The present invention is limited thereto.

The invention claimed is:

1. A device for implementing a function of add-compare-select type in an error correction code decoder, comprising:
    a first adder for adding, for a first branch, a branch metric value, an intermediate value of former state metric, and an offset value of former state metric, thus forming a first value of present state metric;
    a second adder for adding, for a second branch, a branch metric value, an intermediate value of former state metric, and an offset value of former state metric, thus forming a second value of present state metric;
    a comparator, coupled to the first and second adders, for selecting a highest value from among the first and second values of present state metrics;
    a first storage means for storing the selected value of present state metric;
    means for determining a digital offset value of present state metric comprised of a single bit, based on the first and second values of present state metrics; and
    a second storage means for storing the offset value of present state metric.

2. The device of claim 1, wherein the means for determining the digital offset value of present state metric comprises:
    means, coupled to the first and second adders, for determining an absolute value of a difference between the first and second values of present state metrics; and
    a logic operator, coupled to the means for determining the absolute value, to determine the digital offset value of present state metric from said absolute value.

3. The device of claim 2, wherein the means for determining the absolute value comprises:

a first subtractor, coupled to the first and second adders, for determining a first difference between the first value of present state metric and the second value of present state metric;

a second subtractor, coupled to the first and second adders, for determining a second difference between the second value of present state metric and the first value of present state metric;

means, coupled to the first and second subtractors, for comparing the first and second differences and selecting the difference with a highest value.

4. The device of claim 2, wherein the logic operator comprises:

an extractor, coupled to the means for determining the absolute value, for extracting a determined number of bits from the bits of the absolute value;

a calculation unit for providing the digital offset value of present state metric of a single bit based on the extracted bits.

5. The device of claim 1, wherein the means for determining the digital offset value of present state metric comprises:

a first subtractor, coupled to the first and second adders, for determining a first difference between the first value of present state metric and the second value of a present state metric;

a second subtractor, coupled to the first and second adders, for determining a second difference between the second value of present state metric and the first value of present state metric;

a first extractor, coupled to the first subtractor, for providing a first extracted datum comprising a determined number of bits from among the bits of the first difference;

a second extractor, coupled to the second subtractor, for providing a second extracted datum comprising a determined number of bits from among the bits of the second difference;

a first calculation unit, coupled to the first extractor, for providing a first one-bit selection datum from the value of the bits forming the first extracted datum;

a second calculation unit, coupled to the second extractor, for providing a second one-bit selection datum from the value of the bits forming the second extracted datum;

means, coupled to the first and second calculation units, for comparing the first and second selection data and selecting the selection datum having the smallest value as offset value of the present state metric.

6. A method for implementing a function of add-compare-select type for an error correction code decoding, comprising the steps of:

adding, for a first branch, a branch metric value, an intermediate value of former state metric, and an offset value of former state metric, thus forming a first value of present state metric;

adding, for a second branch, a branch metric value, an intermediate value of former state metric, and an offset value of former state metric, thus forming a second value of present state metric;

selecting the highest value from the first and second values of present state metrics;

storing the selected value of present state metric;

determining a digital offset value of present state metric comprised of a single bit, from the first and second values of present state metrics; and storing the offset value of present state metric.

7. The method of claim 6, wherein the step of determination of the digital offset value of present state metric comprises the steps of:

determining the absolute value of the difference between the first and second values of present state metrics; and determining a digital offset value of present state metric comprised of a single bit, from said absolute value.

8. The method of claim 6, wherein the step of determination of the digital offset value of present state metric comprises the steps of:

determining a first difference between the first value of present state metric and the second value of present state metric;

determining a second difference between the second value of present state metric and the first value of present state metric;

providing a first extracted datum comprising a determined number of bits from among the bits of the first difference;

providing a second extracted datum comprising a determined number of bits from among the bits of the second difference;

providing a first one-bit selection datum from the value of the bits forming the first extracted datum;

providing a second one bit selection datum based on the value of the bits forming the second extracted datum; and comparing the first and second selection data and selecting the selection datum having the smallest value as the offset value of present state metric.

9. An add-compare-select-offset unit of an error correction code decoder, comprising:

a first adder to add, for a first branch, a branch metric value, an intermediate value of former state metric, and an offset value of former state metric, to produce a first value of present state metric;

a second adder to add, for a second branch, a branch metric value, an intermediate value of former state metric, and an offset value of former state metric, to produce a second value of present state metric; and offset circuitry to determine a single-bit offset value of present state metric based on the first and second values of present state metrics.

10. The add-compare-select-offset unit of claim 9, further comprising:

means for determining the single-bit offset value based on the first and second values of present state metrics.

11. The add-compare-select-offset unit of claim 9, further comprising:

a comparator, coupled to the first and second adders, to select a highest value from among the first and second values of present state metrics.

12. The add-compare-select-offset unit of claim 11, further comprising:

a third adder to add the single-bit offset value and the selected highest value to produce a datum corresponding to the present state metric.

13. The add-compare-select-offset unit of claim 9, wherein the offset circuitry comprises:

logic circuitry, coupled to the first and second adders, to determine an absolute value of a difference between the first and second values of present state metrics; and a logic operator, coupled to the logic circuitry, to determine the single-bit offset value of present state metric from said absolute value.

14. The add-compare-select-offset unit of claim 13, wherein the logic circuitry comprises:

a first subtractor, coupled to the first and second adders, to determine a first difference between the first value of present state metric and the second value of present state metric;

a second subtractor, coupled to the first and second adders, to determine a second difference between the second value of present state metric and the first value of present state metric;

compare circuitry, coupled to the first and second subtractors, to compare the first and second differences and select the difference with a highest value.

15. The add-compare-select-offset unit of claim 13, wherein the logic operator comprises:

an extractor, coupled to the logic circuitry, to extract a predetermined number of bits from the bits of the absolute value; and a calculation unit to determine the single-bit offset value from the extracted bits.

16. A method of implementing a function of add-compare-select type for decoding an error correction code, the method comprising:

adding, for a first branch, a branch metric value, an intermediate value of former state metric, and an offset value of former state metric, to produce a first value of present state metric;

adding, for a second branch, a branch metric value, an intermediate value of former state metric, and an offset value of former state metric, to produce a second value of present state metric; and determining a single-bit offset value of present state metric from the first and second values of present state metrics.

17. The method of claim 16, further comprising:

selecting a highest value from the first and second values of present state metrics.

18. The method of claim 16, further comprising:

adding the single-bit offset value and the selected highest value to produce a datum corresponding to the present state metric.

19. The method of claim 16, wherein determining the single-bit offset value comprises:

determining an absolute value of a difference between the first and second values of present state metrics; and determining the single-bit offset value from the absolute value.

20. The method of claim 19, wherein determining the absolute value comprises:

determining a first difference between the first value of present state metric and the second value of present state metric;

determining a second difference between the second value of present state metric and the first value of present state metric;

comparing the first and second differences; and selecting the difference with a highest value.

21. The method of claim 19, wherein determining the single-bit offset value from the absolute value comprises:

extracting a predetermined number of bits from the bits of the absolute value; and determining the single-bit offset value from the extracted bits.

* * * * *

UNITED STATES PATENT AND TRADEMARK OFFICE
CERTIFICATE OF CORRECTION

PATENT NO.         : 7,032,165 B2                                      Page 1 of 1
APPLICATION NO. : 10/357561
DATED                : April 18, 2006
INVENTOR(S)       : Pascal Urard and Thierry Valentin It is certified that error appears in the above-identified patent and that said Letters Patent is hereby corrected as shown below:

Col. 3, equation 3 should read:

$$\alpha_k(S_{i,k}) = \sum_{\ell=1}^{N}\sum_{j=0}^{1}\alpha_{k-1}(S_{\ell,k-1})\gamma_k^j(S_{\ell,k-1},S_{i,k}) \qquad (3)$$

equation 4 should read:

$$\beta_k(S_{i,k}) = \sum_{\ell=1}^{N}\sum_{j=0}^{1}\beta_{k+1}(S_{\ell,k+1})\gamma_{k+1}^j(S_{i,k},S_{\ell,k+1}) \qquad (4)$$

equation 5 should read:

$$LLR(x_k) = \log\frac{\sum_{(i,l)\in B(k,1)}\alpha_{k-1}(S_{1,k-1})\gamma_k^1(S_{1,k-1},S_{i,k})\beta_k(S_{i,k})}{\sum_{(i,l)\in B(k,0)}\alpha_{k-1}(S_{1,k-1})\gamma_k^0(S_{1,k-1},S_{i,k})\beta_k(S_{i,k})} \qquad (5)$$

Signed and Sealed this

Eleventh Day of July, 2006

JON W. DUDAS
*Director of the United States Patent and Trademark Office*